United States Patent
Croffie et al.

(10) Patent No.: US 7,264,906 B2
(45) Date of Patent: Sep. 4, 2007

(54) OPC BASED ILLUMINATION OPTIMIZATION WITH MASK ERROR CONSTRAINTS

(75) Inventors: Ebo H. Croffie, Portland, OR (US); Nicholas K. Eib, San Jose, CA (US); Mario Garza, Sunnyvale, CA (US); Paul Filseth, Los Gatos, CA (US); Lav D. Ivanovic, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 487 days.

(21) Appl. No.: 10/794,683

(22) Filed: Mar. 5, 2004

(65) Prior Publication Data

US 2005/0196681 A1  Sep. 8, 2005

(51) Int. Cl.
  G03F 1/00  (2006.01)
  G03C 5/00  (2006.01)
(52) U.S. Cl. ............................................. 430/5; 430/30
(58) Field of Classification Search .................... 430/5, 430/30; 716/19–21
  See application file for complete search history.

(56) References Cited

U.S. PATENT DOCUMENTS

| | | | |
|---|---|---|---|
| 6,622,296 B2* | 9/2003 | Hashimoto et al. | 716/19 |
| 7,030,966 B2* | 4/2006 | Hansen | 355/67 |
| 2004/0158808 A1* | 8/2004 | Hansen | 716/21 |

\* cited by examiner

*Primary Examiner*—S. Rosasco
(74) *Attorney, Agent, or Firm*—Trexler, Bushnell, Giangiorgi, Blackstone & Marr, Ltd.

(57) ABSTRACT

A method and system of optimizing the illumination of a mask in a photolithography process. A specific, preferred method includes the steps of: loading minimum design rules of a layout, loading exposure latitude constraints, loading mask error constraints, loading initial illumination conditions, simulating current illumination conditions, obtaining dose-to-print threshold from the minimum design rules (i.e., lines-and-space feature), applying OPC on the layout using the dose-to-print threshold, calculating DOF using the exposure latitude and mask error constraints, changing the illumination conditions in order to attempt to maximize common DOF with the exposure latitude and mask error constraints, and continuing the process until maximum common DOF is obtained.

9 Claims, 2 Drawing Sheets

OPC BASED ILLUMINATION OPTIMIZATION WITH MASK ERROR CONSTRAINTS

BACKGROUND

The present invention generally relates to photolithography, and more specifically relates to methods for optimizing the illumination of masks in a photolithography process, in order to achieve maximum common process window.

Making a semiconductor device, such as an integrated circuit (IC), involves using photolithography to form patterns on a wafer, where the patterns correspond to complex circuitry. During the process, the patterns are initially formed on a reticle or mask, and then the patterns are exposed on the wafer by shining a light through, or illuminating, the mask.

Depth of focus (DOF) indicates the range of distances around a focal plane where the image quality is sharp. It is important to optimize the illumination of a mask to achieve maximum common DOF, as this results in the best exposure of the wafer.

Mask error factor limits the amount of a common process window which is useable. Additionally, Optical Proximity Correction (OPC) is common in the industry and involves the pre-compensation of predicted defects of a circuit design. The focus-exposure window of features which have not been adjusted based on OPC techniques is not representative of the common process window of the design after OPC techniques have been applied. FIG. 1 provides a flow chart which illustrates a prior art illumination optimization technique. Current methods of optimizing the illumination of masks are based on the focus-exposure window, and do not take into account mask error constraints or OPC. As a result, current illumination optimization techniques are sub-optimal. For example, they do not make readily apparent the difference between common process window of different mask types, such as attenuated phase shift masks (PSM) and binary masks.

OBJECTS AND SUMMARY

An object of an embodiment of the present invention is to provide an illumination optimization method which takes into account mask error constraints and OPC.

Another object of an embodiment of the present invention is to provide an illumination optimization method which makes readily apparent the difference between common process window of different mask types, such as attenuated phase shift masks (PSM) and binary masks.

Briefly, and in accordance with at least one of the foregoing objects, an embodiment of the present invention provides a method of optimizing the illumination of a mask in a photolithography process. A specific, preferred method includes the steps of: loading minimum design rules of a layout, loading exposure latitude constraints, loading mask error constraints, loading initial illumination conditions, simulating current illumination conditions, obtaining dose-to-print threshold from the minimum design rules (i.e., lines-and-space feature), applying OPC on the layout using the dose-to-print threshold, calculating DOF using the exposure latitude and mask error constraints, changing the illumination conditions in order to attempt to maximize common DOF with the exposure latitude and mask error constraints, and continuing the process until maximum common DOF is obtained. Another embodiment of the present invention provides a system which is configured to effect the method described.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
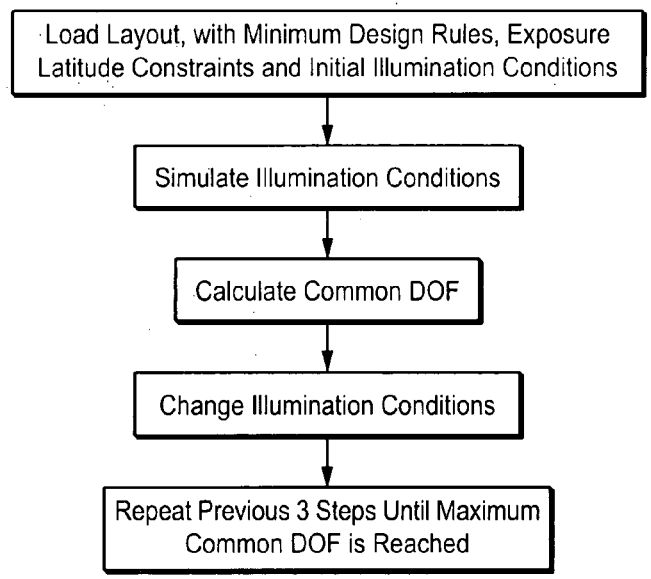
FIG. 1 provides a flow chart which illustrates a prior art illumination optimization technique, wherein neither mask error constraints nor OPC is taken into account.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
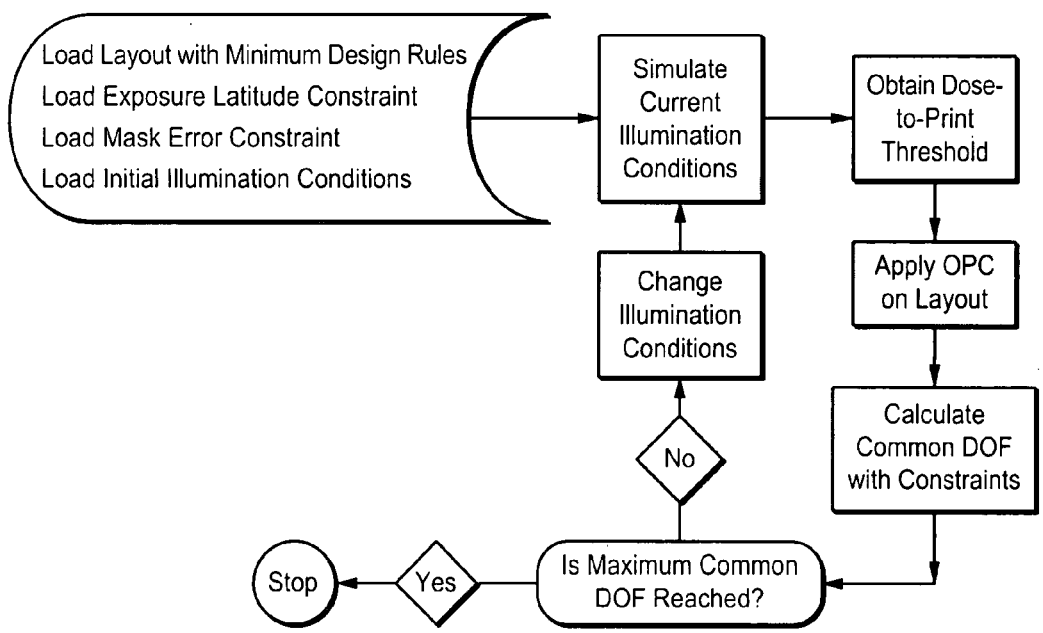
FIG. 2 provides a flow chart which illustrates an illumination optimization technique which is in accordance with an embodiment of the present invention, wherein mask error constraints and OPC are taken into account.

FIG. 2 provides a flow chart which illustrates an illumination optimization technique which is in accordance with an embodiment of the present invention, wherein mask error constraints and OPC are taken into account. By taking mask error constraints and OPC into account, the technique is more optimal than techniques which are currently widely used (see FIG. 1). Additionally, the difference between common process window of different mask types, such as attenuated phase shift masks (PSM) and binary masks, are more apparent.

As shown in FIG. 2, a specific, preferred method includes the steps of: loading minimum design rules of a layout, loading exposure latitude constraints (i.e., a given % deviation from nominal exposure energy that maintains wafer CDs within a given specification), loading mask error constraints (i.e., a given % deviation from nominal mask CD that maintains wafer CDs within a given specification), loading initial illumination conditions (wherein a typical set of conditions may be: light source wavelength=0.193 micrometers, light source aperture=annular (outer sigma=0.7, inner sigma=0.4), objective lens numerical aperture=0.63, exposure energy (also known as dose)=20 mJ), simulating current illumination conditions, obtaining dose-to-print threshold (i.e., the simulated light intensity level (threshold) that gives the desired CD of a given GDS feature) from the minimum design rules (i.e., lines-and-space feature), applying OPC on the layout using the dose-to-print threshold, calculating DOF using the exposure latitude and mask error constraints, changing the illumination conditions in order to attempt to maximize common DOF with the exposure latitude and mask error constraints, and continuing the process until maximum common DOF is obtained.

Figure 3:
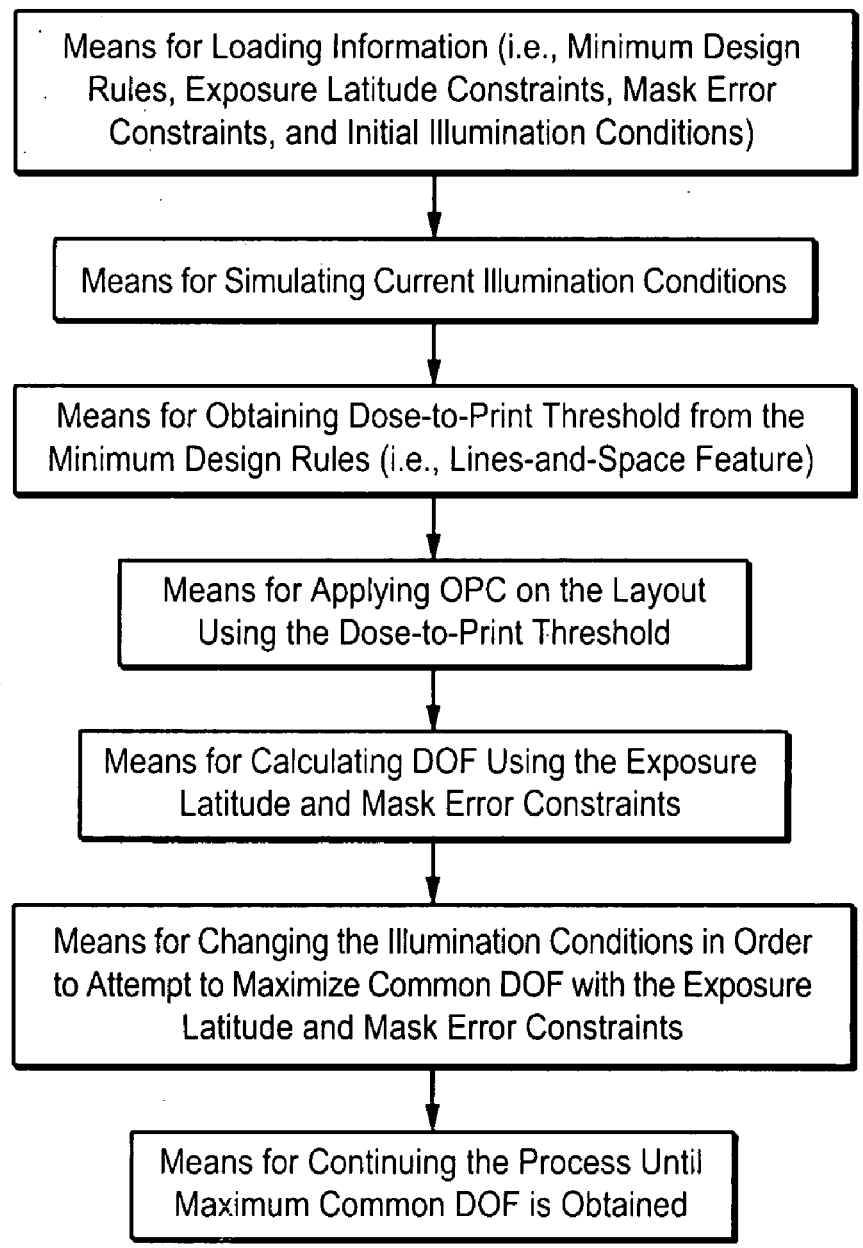
FIG. 3 provides a block diagram of a system which is in accordance with an embodiment of the present invention, wherein the system can be used to effect the method shown in FIG. 2.

FIG. 3 illustrates a system which can be used to effect the method shown in FIG. 2. As shown, the system includes:

means for loading minimum design rules of a layout, loading exposure latitude constraints, loading mask error constraints, and loading initial illumination conditions, means for simulating current illumination conditions, means for obtaining dose-to-print threshold from the minimum design rules (i.e., lines-and-space feature), means for applying OPC on the layout using the dose-to-print threshold, means for calculating DOF using the exposure latitude and mask error constraints, means for changing the illumination conditions in order to attempt to maximize common DOF with the exposure latitude and mask error constraints, and means for continuing the process until maximum common DOF is obtained. In each case, the means may be effected viz-a-viz hardware and/or software.

While embodiments of the present invention are shown and described, it is envisioned that those skilled in the art may devise various modifications of the present invention without departing from the spirit and scope of the appended claims.

What is claimed is:

1. A method of optimizing the illumination of a mask in a photolithography process, said method comprising: loading information regarding a layout, said information comprising minimum design rules of the layout and mask error constraints; simulating illumination; obtaining dose-to-print threshold from the minimum design rules; applying OPC on the layout using the dose-to-print threshold; calculating DOF using the mask error constraints; changing the illumination conditions in order to attempt to maximize common DOF, wherein the mask error constraints and OPC are taken into account in attempting to maximize common DOF.

2. A method as recited in claim 1, said information further comprising exposure latitude constraints, said step of calculating DOF further comprising using the exposure latitude constraints.

3. A method as recited in claim 1, said information further comprising initial illumination conditions, said step of simulating illumination comprising using the initial illumination conditions.

4. A method as recited in claim 1, further comprising re-simulating illumination using the revised illumination conditions.

5. A method of optimizing the illumination of a mask in a photolithography process, said method comprising: loading information regarding a layout, said information comprising minimum design rules of the layout, exposure latitude constraints, mask error constraints, and initial illumination conditions; simulating illumination conditions; obtaining dose-to-print threshold from the minimum design rules; applying OPC on the layout using the dose-to-print threshold; calculating DOF using the exposure latitude and mask error constraints; and changing the illumination conditions in order to attempt to maximize common DOF with the exposure latitude and mask error constraints.

6. A system for optimizing the illumination of a mask in a photolithography process, said system comprising: means for loading information regarding a layout, said information comprising minimum design rules of the layout and mask error constraints; means for simulating illumination; means for obtaining dose-to-print threshold from the minimum design rules; means for applying OPC on the layout using the dose-to-print threshold; means for calculating DOF using the mask error constraints; and means for changing the illumination conditions in order to attempt to maximize common DOF, wherein the system is configured to provide that mask error constraints and OPC are taken into account in attempting to maximize common DOF.

7. A system as recited in claim 6, said information further comprising exposure latitude constraints, said means for calculating DOF further comprising means for using the exposure latitude constraints.

8. A system as recited in claim 6, said information further comprising initial illumination conditions, said means for simulating illumination comprising means for using the initial illumination conditions.

9. A system as recited in claim 6, further comprising means for re-simulating illumination using the revised illumination conditions.

* * * * *